(12) United States Patent
Liu et al.

(10) Patent No.: US 7,821,050 B1
(45) Date of Patent: Oct. 26, 2010

(54) CRAM TRANSISTORS WITH HIGH IMMUNITY TO SOFT ERROR

(75) Inventors: Yowjuang (Bill) Liu, San Jose, CA (US); Cheng-Hsiung Huang, Cupertino, CA (US); Chih-Ching Shih, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 387 days.

(21) Appl. No.: 11/497,017

(22) Filed: Jul. 31, 2006

(51) Int. Cl.
*H01L 27/108* (2006.01)
*H01L 29/94* (2006.01)

(52) U.S. Cl. .................. 257/298; 257/203; 257/202; 257/393; 257/903; 365/154; 354/194; 354/161

(58) Field of Classification Search .................. 257/288, 257/412, 384, 202, 203, 298, 393, 903, 379, 257/369; 438/216, 591, 261; 365/49–120, 365/154; 354/194, 161
See application file for complete search history.

(56) References Cited

U.S. PATENT DOCUMENTS

| | | | |
|---|---|---|---|
| 4,954,738 A * | 9/1990 | Gaudenzi | 326/126 |
| 6,031,778 A * | 2/2000 | Makino et al. | 365/226 |
| 6,144,611 A * | 11/2000 | Tarbouriech | 365/230.06 |
| 6,421,265 B1 * | 7/2002 | Lien et al. | 365/49.15 |
| 6,867,084 B1 * | 3/2005 | Chiu et al. | 438/216 |
| 6,949,782 B2 * | 9/2005 | Atwood et al. | 257/296 |
| 7,113,433 B2 * | 9/2006 | Chan et al. | 365/190 |
| 7,113,445 B1 * | 9/2006 | Sancheti et al. | 365/230.05 |
| 7,388,772 B1 * | 6/2008 | Xu et al. | 365/154 |
| 2004/0164326 A1 * | 8/2004 | Atwood et al. | 257/202 |
| 2004/0165418 A1 * | 8/2004 | Lesea | 365/154 |
| 2004/0235285 A1 * | 11/2004 | Kang et al. | 438/597 |
| 2006/0065939 A1 * | 3/2006 | Doczy et al. | 257/412 |
| 2007/0087575 A1 * | 4/2007 | Iyer et al. | 438/758 |

* cited by examiner

*Primary Examiner*—Mary Wilczewski
*Assistant Examiner*—Telly D Green
(74) *Attorney, Agent, or Firm*—Ward & Olivo LLP

(57) ABSTRACT

A transistor fabricated on a semiconductor substrate includes a source and a drain in the substrate; a gate on the substrate, the gate being insulated from the substrate by gate dielectric; barrier layers covering two sides of the gate and the gate dielectric; spacers of high-k material covering the barrier layers; and nitride spacers covering the spacers of high-k material. The spacers of high-k material significantly increase the node capacitance of the transistor and therefore reduce the transistor's soft error rate.

17 Claims, 4 Drawing Sheets

CRAM TRANSISTORS WITH HIGH IMMUNITY TO SOFT ERROR

FIELD OF THE INVENTION

This application relates to the design and manufacture of configuration random access memory (CRAM).

BACKGROUND OF THE INVENTION

An important trend in modern micro-electronics is to reduce the size of an individual node (e.g., a transistor) in a circuit and its required operating voltage so as to increase its operating speed. This trend leads to a smaller node capacitance and therefore a smaller critical charge, which is the minimum electron charge disturbance that will change the logic level of a node.

The reduction of critical charge increases the chance of a circuit (e.g., a DRAM device) experiencing soft errors. A soft error is a wrong signal or datum caused by something other than a defective component in a circuit resulting from mistakes in circuit design or manufacture. One cause of soft error is environmental factors. For example, high-energy neutrons in cosmic rays can induce soft errors via secondary ions (e.g., positively charged alpha particles) produced when the neutrons collide with silicon nuclei.

Therefore, there is a need for semiconductor design and manufacture methodologies that can reduce the soft error rate (SER) of a circuit without adversely affecting its performance.

SUMMARY OF THE INVENTION

In a preferred embodiment of the present invention, a transistor fabricated on a semiconductor substrate includes a source and a drain in the substrate; a gate on the substrate, the gate being insulated from the substrate by gate dielectric; barrier layers covering the sides of the gate and the gate dielectric; spacers of high-k material covering the barrier layers; and nitride spacers covering the spacers of high-k material. The spacers of high-k material significantly increase the node capacitance of the transistor and thereby reduce the transistor's soft error rate.

BRIEF DESCRIPTION OF THE DRAWINGS

These and other objects, features and advantages of the present invention will be more readily apparent from the following Detailed Description in which.

DETAILED DESCRIPTION

Generally, the critical charge of a node is a function of the node capacitance and its operating voltage. Increasing the node capacitance increases the node's critical charge and therefore reduces the node's SER. But increasing the node capacitance may affect the node's performance because it takes more time to charge/discharge a node. This side effect is undesirable in those applications where a node's performance is so critical, e.g., a DRAM device. However, this approach can be applied in situations where slightly slower node performance is acceptable.

The CRAM used in a field programmable gate logic (FPGA) is such an example. Typically, the CRAM stores data for configuring the FPGA when the FPGA is powered up. After the initial configuration, the FPGA performs predefined operations with little interaction with the CRAM. Further, the data in the CRAM is usually fixed, and the need to alter the data is very low. Therefore, a slightly slow CRAM does not impose a significant penalty on the performance of the FPGA. On the other hand, since the data in the CRAM is used for configuring the FPGA, a soft error in the CRAM could potentially have a severe impact on the operation of the FPGA. Therefore, reducing the CRAM's SER is often more critical than increasing its operating speed.

Figure 1:
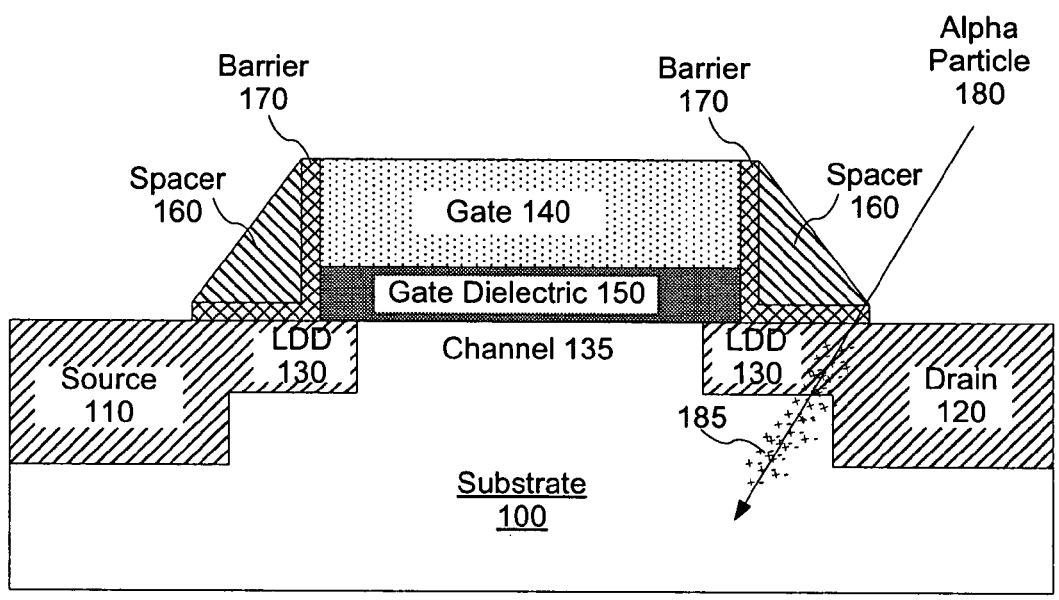
FIG. 1 is a cross-sectional view of a prior art CRAM transistor.

FIG. 1 is a cross-sectional view of a prior art CRAM transistor 10. The transistor 10 is fabricated on a semiconductor substrate 100. Transistor 10 includes a source 110, a drain 120 and a gate 140. Source 110 and drain 120 are two highly doped regions, which can be either P or N type. If they are P type, the transistor is a PMOS transistor; and if they are N type, the transistor is an NMOS transistor. Both source 110 and drain 120 include a lightly doped drain 130 (LDD). LDD 130 reduces the doping gradient between the source 110/drain 120 and channel 135, lowers the electric field in channel 135 in the vicinity of the source 110/drain 120 and thereby makes transistor 10 more reliable.

Between gate 140 and channel 135 is a layer of gate dielectric 150. Gate dielectric 150 insulates gate 140 from source 110 and drain 120. A barrier 170, typically comprised of silicon dioxide ($SiO_2$), is formed on each side of gate 140 and gate dielectric 150. The barrier serves at least two purposes. First, it helps to protect gate dielectric 140 from some chemical materials used in fabrication of the transistor. Second, it further insulates gate 140 from source 110 and drain 120. Each barrier 170 is covered by a spacer 160. Spacer 160 is typically made of materials such as silicon nitride $Si_3N_4$. It further insulates gate 140 from source 110 and drain 120. Moreover, it is also compatible with other materials (e.g., copper or aluminum) deposited on transistor 10.

Figure 4:
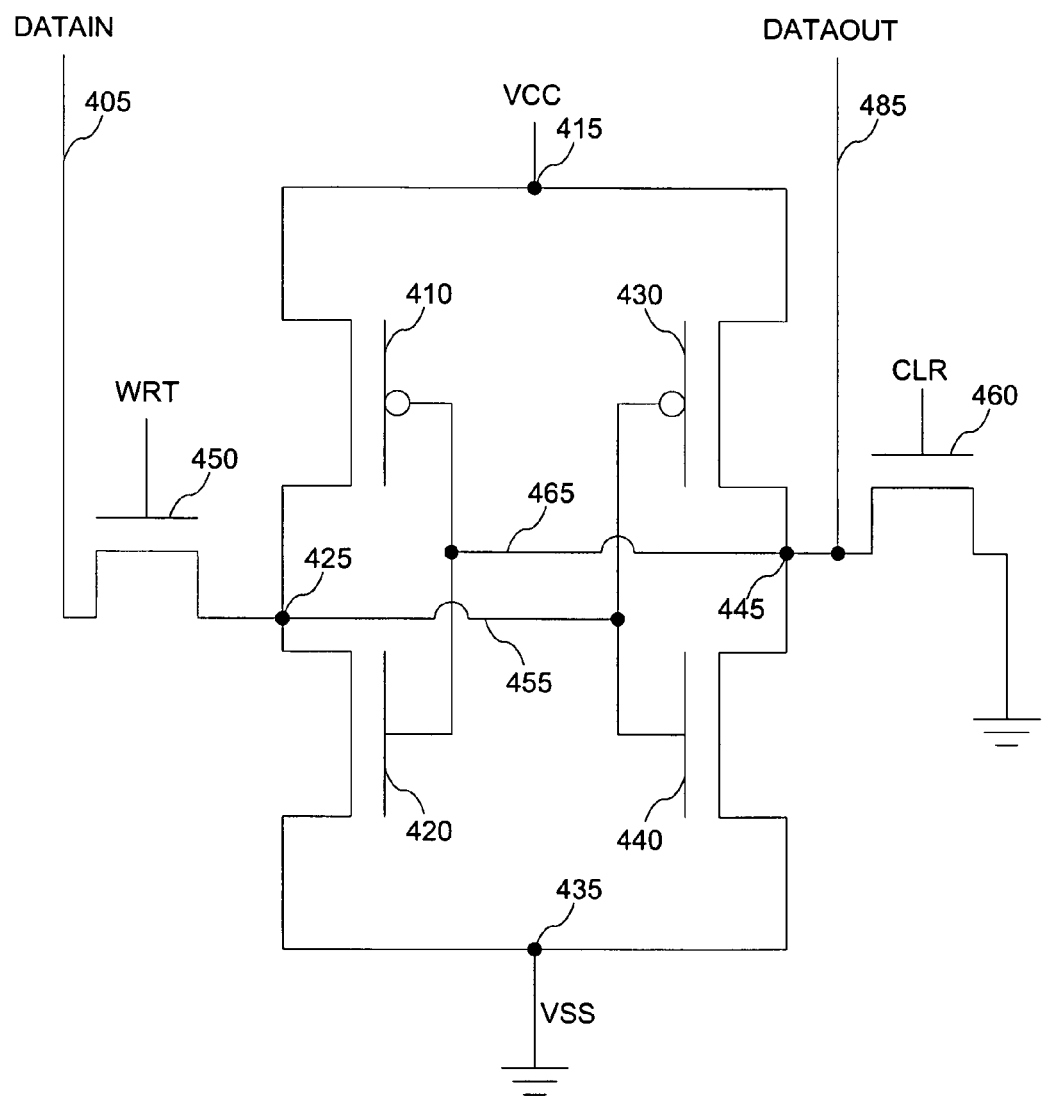
FIG. 4 is a circuit diagram of a latch circuit according to some embodiments of the present invention.

The CRAM is typically comprised of many latch circuits, each latch circuit including two inverters comprising several (e.g., four) transistors like transistor 10. An exemplary latch circuit is shown in FIG. 4. As shown in FIG. 1, when an alpha particle 180 hits the semiconductor layer of transistor 10, it leaves a cylindrical track of electron-hole pairs 185. When the track of electron-hole pairs 185 traverses or comes close to the channel 135 of transistor 10, the electric field in the channel 135 rapidly collects carriers from the track of electron-hole pairs 185, creating a current/voltage glitch at transistor 10. When the current/voltage glitch reaches a certain level, the data bit stored at the latch circuit including transistor 10 may flip, e.g., from 0 to 1 or from 1 to 0. The closer to the channel 135 the hit by the alpha particles 180 occurs, the larger the current/voltage glitch and therefore the more likely a soft error will occur.

As noted above, increasing the node capacitance can increase the critical charge of the node. As a result, a larger current/voltage glitch is required to induce a soft error. One approach to increasing the node capacitance requires additional implants near the source and drain of a transistor. This method not only increases the process complexity but also has many side effects such as higher junction leakage, lower junction breakdown, lower transistor drive current, and a larger footprint on the semiconductor substrate. Another approach is to add a coupling capacitor between the inverters within a latch circuit. This method may significantly increase the size of the footprint of a latch circuit and is not cost-effective.

Figure 2:
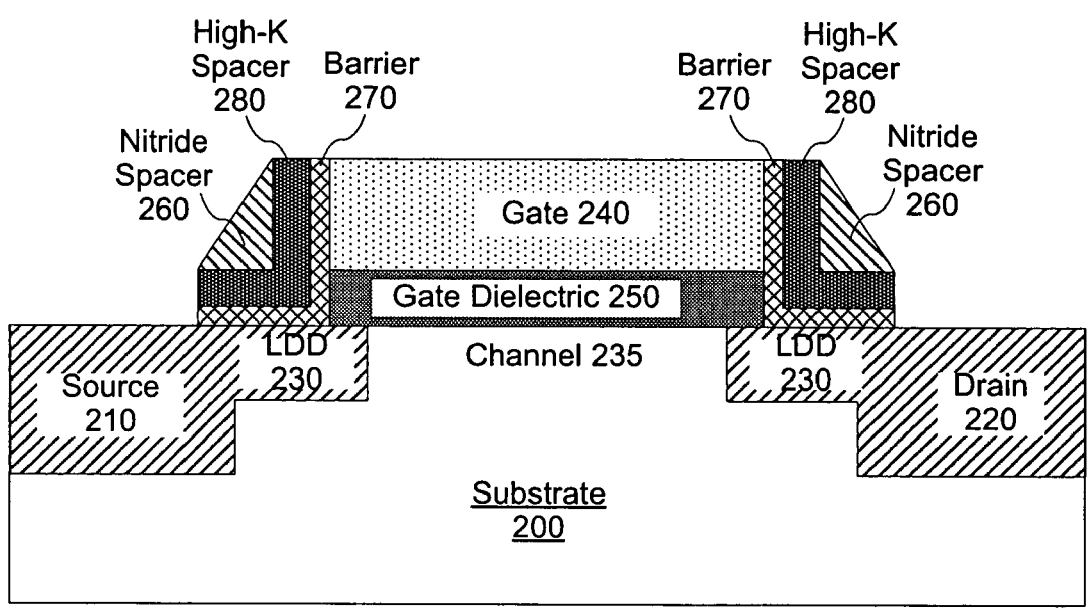
FIG. 2 is a cross-sectional view of a CRAM transistor according to one embodiment of the present invention.

FIG. 2 is a cross-sectional view of a CRAM transistor according to one embodiment of the present invention. It can substantially increase the node capacitance without the drawbacks associated with the conventional approaches. As shown in FIG. 2, the structure of the transistor 20 is very similar to that of the transistor 10. Transistor 20 is fabricated on a semiconductor substrate 200. It has a source 210, a drain 220 and a gate 240. Source 210 and drain 220 are two highly doped regions, which can be either P or N type. If they are P type, the transistor is a PMOS transistor; and if they are N type, the transistor is an NMOS transistor. Both source 210 and drain 220 include a LDD 230. LDD 230 reduces the doping gradient between the source 210/drain 220 and channel 235, lowers the electric field in channel 235 in the vicinity of the source 210/drain 220 and thereby makes transistor 20 more reliable.

Between gate 240 and channel 235 is a layer of gate dielectric 250. Gate dielectric 250 insulates gate 240 from source 210 and drain 220. A barrier 270 is formed on each side of gate 240 and gate dielectric 250. The barrier 270 has two functions. First, it helps to protect gate dielectric 240 from some chemical materials used in fabrication of the transistor. Second, it further insulates gate 240 from source 210 and drain 220. Unlike transistor 10 in FIG. 1, barriers 270 are not covered by conventional spacers. Rather, they are covered by spacers 280 of high-k material where k is the relative permittivity of the material. These two high-k spacers 280 significantly increase the node capacitance since the capacitance is proportional to the k value. Note that there is no special requirement as to the type of high-k material used to form the spacer. Any material with a dielectric constant higher than that of the silicon nitride can be employed in the present invention. Unlike the formation of gate dielectric, interface or work function mismatches in the formation of the high-k spacer are of a lesser concern. Therefore, a broad selection of high-k materials including, but not limited to, Hafnium Dioxide ($HfO_2$), Zirconium Dioxide ($ZrO_2$), Titanium Dioxide ($TiO_2$), Barium Oxide (BaO), Tantalum Oxide ($Ta_2O_5$), and Lanthanum Oxide ($La_2O_3$) can be used to form high-k spacers.

Since the rest of the FPGA requires a smaller node capacitance than the CRAM to achieve a high performance, it is necessary to prevent the high-k material from being deposited onto the area outside the CRAM during the process of forming the high-k spacer. Thus, FPGA fabrication process requires an additional mask and a three-step formation of a high-k spacer. The additional mask covers up the CRAM and selected area so that only the high-k material outside the CRAM and selected area is removed after deposition. This is a slight modification to the standard process. It is both reliable and cost-effective. The cost of making the mask is relatively low since it does not relate to the feature size or critical dimension of the device. The three-step procedure for formation of the high-k spacer comprises: a) high-k material deposition, b) selective masking of some of the high-k material to cover the CRAM area, and c) removal of the high-k material outside the CRAM area. According to some embodiments, this three-step procedure is performed after the formation of barrier 270 but before the formation of nitride spacer 260.

Finally, a nitride spacer 260 is formed on the high-k spacer 280. As noted above, a nitride spacer further insulates gate 240 from source 210 and drain 220 and also improves the compatibility of the CRAM and the other components in the FPGA. Note that nitride spacer 260 is optional if the two high-k spacers 280 are compatible with the other components in the FPGA.

Figure 3:
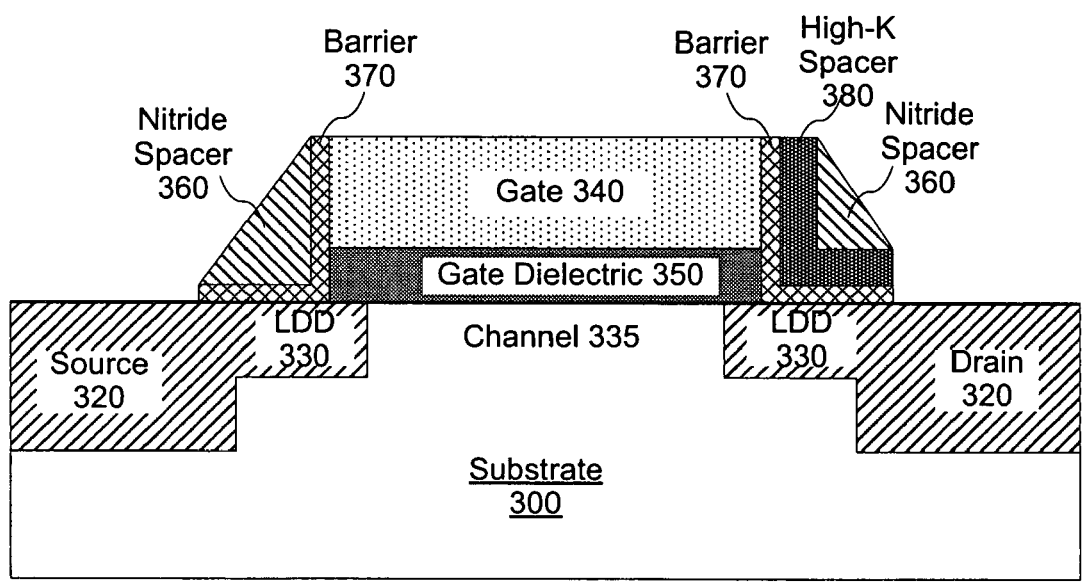
FIG. 3 is a cross-sectional view of a CRAM transistor according to another embodiment of the present invention.

FIG. 3 is a cross-sectional view of a CRAM transistor 30 according to another embodiment of the present invention. Transistor 30 includes a source 310, a drain 320 and a gate 340. Lightly doped drains (LDD) 330 extend from source 310 and drain 320 toward channel 335. Between gate 340 and channel 335 is a layer of gate dielectric 350. A barrier 370 is formed on each side of gate 340 and gate dielectric 350. On the left side of transistor 30 a nitride spacer 360 covers barrier 370. On the right side, a spacer 380 of high-k material covers barrier 370; and spacer 380, in turn, is covered by a nitride spacer 360. As will be apparent, the left side of transistor 30 is like the left side of transistor 10 in FIG. 1 and the right side of transistor 30 is like the right side of transistor 20 in FIG. 2. High-k spacer 380 on the right side of transistor 30 increases its node capacitance and therefore reduces the SER. But its node capacitance is not as high as that of transistor 20 since there is no high-k spacer on the other side of transistor 30. In other words, transistor 30 is a compromise between transistors 10 and 20. It may be used in those applications when both the performance of the transistor and the SER are of concern. Of course, the fabrication of transistor 30 may require a more expensive mask to deposit the high-k material only where it is wanted.

FIG. 4 is a circuit diagram of a latch circuit 40 comprising six transistors 410-460. Among them, at least the transistors 410, 420, 430 and 440 include high-k spacers according to the embodiments of the present invention. Each transistor has a source, a drain and a gate. Transistors 410 and 430 are preferably PMOS transistors; and transistors 420 and 440 are preferably NMOS transistors. The first and second transistors 410, 420 are connected in series such that a source and drain of the first transistor 410 are connected between a first node 415 and a second node 425 and the source and drain of the second transistor 420 are connected between a third node 435 and the second node 425. The third and fourth transistors 430, 440 are connected in series such that a source and drain of the third transistor 430 are connected between the first node 415 and a fourth node 445 and the source and drain of the fourth transistor 440 are connected between the third node 435 and the fourth node 445. The first node 415 is connected to a positive power supply VCC and the third node 435 is connected to the ground VSS. The voltage level at the node 415 represents a logic high and the ground potential a logic low. The transistors 410 and 420 form a first inverter having an input at the gates of the transistors 410, 420 and an output at the second node 425. The transistors 430, 440 form a second inverter having an input at the gates of transistors 430, 440 and an output at fourth node 445.

The first and second inverters are cross-coupled by two metal interconnects 455, 465. In particular, the metal interconnect 455 is connected between the second node 425 and the gates of the transistors 430, 440 and the metal interconnect 465 is connected between the fourth node 445 and the gates of the transistors 410, 420.

The source and drain of the transistor 450 are connected between a data in line 405 and second node 425. Thus, the transistor 450 functions as a write transistor for the latch circuit 40. The source and drain of transistor 460 are connected between the fourth node 445 and the ground. Thus, the transistor 460 functions as a clear transistor for the latch circuit 40. A data out line 465 is connected to the node 445.

In operation, the latch circuit 40 is cleared by applying a positive signal to the gate of transistor 460 to turn it on. As a result, the node 445 is bought to essentially the ground potential. Since the node 445 is connected to the gates of transistor 410, 420 by the interconnect 465, the ground potential is applied to those gates, turning on the transistor 410 and turning off the transistor 420. As a result, the potential at the node 425 rises to approximately the potential of the node 415. Since the node 425 is connected to the gates of transistors 430, 440 by the interconnect 455, a high potential is applied to these gates, turning off the transistor 430 and turning on the transistor 440. As a result, the potential at the node 445 which had been brought to the ground potential by the transistor 460 is now held at the ground potential by the transistor 440.

Thus, as a result of the clear operation, a high potential is established at the node 425 and a low potential at the node 445. This is one of the two binary values that can be stored in the latch circuit 40. To store this value in the latch circuit, there is no need to do anything after the latch circuit is cleared. Alternatively, if a high potential signal is applied to the latch circuit 40 from the data in line 405 by turning on the transistor 450, the high potential will be applied to the node 425 and this high potential will also be applied to the gates of the transistors 430, 440, thereby turning on transistor 440 so that the potential at the node 445 is approximately the ground potential.

On the other hand, if a low potential signal is written to the latch circuit 40 by turning on the transistor 450 after the latch circuit 40 has been cleared, the low potential signal will be applied to the node 425 and this low potential will reduce the voltage at the gates of the transistors 430, 440 thereby turning on the transistor 430, and turning off the transistor 440. As a result, the potential at the node 445 rises to approximately the potential of the power supply node 415. This causes the potential at the gates of the transistors 410, 420 to rise, thereby turning off the transistor 410 and turning on the transistor 420. As a result, the potential at the node 425, which had been brought to a low potential by the transistor 450 is now held at the ground potential by the transistor 420. Thus, as a result of the write low operation, a low potential is at the node 425 and a high potential at the node 445. This is the second of the binary values that can be stored in the latch circuit 40.

If the transistor 10 in FIG. 1 is used for constructing the latch circuit 40, the alpha particles hitting the nodes 425, 445 of the latch circuit 40 may disturb the distribution of electrons at the nodes and even cause bit flips to the latch circuit. However, according to some embodiments of the present invention, by replacing the conventional transistors with the transistors including the high-k spacers, the total node capacitance of the same latch circuit 40 can be increased at least 70%. As a result, the SER of the latch circuit 40 is reduced by at least 80%. In some other embodiments, besides the four transistors 410-440 of the latch circuit 40, high-k spacers can be formed in the write transistor 450 and/or the clear transistor 460 to increase the latch circuit's critical charge for better SER protection.

The foregoing description, for purpose of explanation, has been set forth with reference to specific embodiments. However, the illustrative discussions above are not intended to be exhaustive or limit the invention to the precise forms disclosed. For example, one skilled in the art will find that the high-k material may be used to form a power decoupling capacitor to filter out the high-frequency noise of the power signal and produce a more stable power voltage level. Still other variations will be obvious to one of ordinary skill in the art.

What is claimed is:

1. A transistor fabricated on a semiconductor substrate, comprising:
    a source and drain in the substrate;
    a gate on the substrate, the gate being insulated from the substrate by gate dielectric, the gate and gate dielectric having first and second sides;
    a barrier layer covering at least a portion of the first side of the gate and gate dielectric and at least a portion of the second side of the gate and gate dielectric and extending outward on the substrate from both the first and second sides;
    a spacer of high-k material formed on at least a portion of the barrier layer and extending outward on the barrier layer on both the first and second sides and separated from the gate and gate dielectric and from the substrate by the barrier layer wherein the high-k material has a dielectric constant greater than that of silicon nitride.

2. A transistor fabricated on a semiconductor substrate, comprising:
    a source and a drain in the substrate; and
    a gate on the substrate, the gate being insulated from the substrate by gate dielectric;
    wherein the gate and the gate dielectric have two first and second sides, the first side of the gate and the gate dielectric covered by a first barrier layer in direct contact with the gate and gate dielectric, a spacer of high-k material formed on the first barrier layer wherein the high-k material has a dielectric constant greater than that of silicon nitride, and a first nitride spacer covering at least a portion of the spacer of high-k material and the second side of the gate and the gate dielectric covered by a second barrier layer in direct contact with the gate and gate dielectric and a second nitride spacer covering at least a portion of the second barrier layer.

3. The transistor of claim 2, wherein the spacer of high-k material is made of materials selected from the group consisting of Hafnium Dioxide (HfO2), Zirconium Dioxide (ZrO2), Titanium Dioxide (TiO2), Barium Oxide (BaO), Tantalum Oxide (Ta2O5), and Lanthanum Oxide (La2O3).

4. A transistor fabricated on a semiconductor substrate, comprising:
    a source and a drain in the substrate;
    a gate on the substrate, the gate being insulated from the substrate by gate dielectric;
    barrier layers covering first and second sides of the gate and the gate dielectric and extending outward on the substrate from both the first and second sides;
    a spacer of high-k material covering the barrier layer on the first side of the gate wherein the high-k material has a dielectric constant greater than that of silicon nitride; and
    nitride spacers covering the spacer of high-k material on the first side of the gate and the barrier layer on the second side of the gate.

5. The transistor of claim 4, wherein the spacer of high-k material is made of materials selected from the group consisting of Hafnium Dioxide (HfO2), Zirconium Dioxide (ZrO2), Titanium Dioxide (TiO2), Barium Oxide (BaO), Tantalum Oxide (Ta2O5), and Lanthanum Oxide (La2O3).

6. A latch circuit, comprising:
    a first pair of transistors comprising a first transistor and a second transistor connected in series between a first node and a second node, the first transistor having a first conductivity type and the second transistor having a second conductivity type;
    a second pair of transistors comprising a third transistor and a fourth transistor connected in parallel with the first pair of transistors between the first node and the second node, the third transistor having the first conductivity type and the fourth transistor having the second conductivity type;
    a first metal interconnect connected between gates of the first pair of transistors and a third node between the second pair of transistors; and a second metal interconnect connected between gates of the second pair of transistors and a fourth node between the first pair of transistors;

wherein at least one of the four transistors includes:

a substrate;

a barrier layer covering first and second sides of a gate and gate dielectric of the transistor and extending outward on the substrate from the first and second sides;

a spacer of high-k material wherein the high-k material has a dielectric constant greater than that of silicon nitride, the spacer covering the barrier layer on the first and second sides and extending outward on the barrier layer on both the first and second sides; and a nitride spacer covering at least a portion of the spacer of high-k material.

7. The latch circuit of claim 6, further comprising:

a write transistor connected between a data in line and the fourth node; and a clear transistor connected between the third node and the second node.

8. The latch circuit of claim 7, wherein at least one of the write and clear transistors includes a spacer of high-k material.

9. The latch circuit of claim 8, wherein the spacer of high-k material in the at least one of the write and clear transistors is made of a material selected from the group consisting of Hafnium Dioxide (HfO2), Zirconium Dioxide (ZrO2), Titanium Dioxide (TiO2), Barium Oxide (BaO), Tantalum Oxide (Ta2O5), and Lanthanum Oxide (La2O3).

10. The latch circuit of claim 6, further comprising a data out line connected to the third node.

11. The latch circuit of claim 6, wherein the first node is connected to a non-zero voltage supply and the third node is connected to ground.

12. The latch circuit of claim 6, wherein the first conductivity type is P type and the second conductivity type is N type.

13. The latch circuit of claim 6, wherein the first conductivity type is N type and the second conductivity type is P type.

14. The latch circuit of claim 6, wherein the spacer of high-k material is made of a material selected from the group consisting of Hafnium Dioxide (HfO2), Zirconium Dioxide (ZrO2), Titanium Dioxide (TiO2), Barium Oxide (BaO), Tantalum Oxide (Ta2O5), and Lanthanum Oxide (La2O3).

15. The latch circuit of claim 6, wherein each of the four transistors has a spacer of high-k material.

16. The latch circuit of claim 6, wherein the first pair of transistors form a first inverter and the second pair of transistors form a second inverter.

17. The latch circuit of claim 6, wherein the latch circuit is part of a configuration memory cell in a field programmable gate array.

* * * * *